United States Patent
Haga et al.

(10) Patent No.: US 8,368,234 B2
(45) Date of Patent: Feb. 5, 2013

(54) SEMICONDUCTOR DEVICE, PRODUCTION METHOD FOR THE SAME, AND SUBSTRATE

(75) Inventors: Motoharu Haga, Kyoto (JP); Yasumasa Kasuya, Kyoto (JP); Hiroaki Matsubara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 48 days.

(21) Appl. No.: 12/929,425

(22) Filed: Jan. 24, 2011

(65) Prior Publication Data

US 2011/0115089 A1    May 19, 2011

Related U.S. Application Data

(62) Division of application No. 12/064,434, filed as application No. PCT/JP2006/316240 on Aug. 18, 2006, now Pat. No. 7,902,681.

(30) Foreign Application Priority Data

Aug. 22, 2005  (JP) ................................. 2005-240285

(51) Int. Cl.
  *H01L 23/52*  (2006.01)
  *H01L 23/48*  (2006.01)
  *H01L 29/40*  (2006.01)

(52) U.S. Cl. .................. 257/782; 257/E23.04; 257/781; 257/783; 257/786; 438/118; 438/612

(58) Field of Classification Search ........... 257/E23.023, 257/700–702, 741, E23.04, 781–783, 785, 257/786; 361/792–795; 438/118, 612, 614, 438/617, 666
See application file for complete search history.

(56) References Cited

U.S. PATENT DOCUMENTS

| | | | | |
|---|---|---|---|---|
| 4,770,900 A | * | 9/1988 | Seibel | 430/314 |
| 5,302,492 A | * | 4/1994 | Ott et al. | 430/314 |
| 5,445,311 A | * | 8/1995 | Trask et al. | 228/175 |
| 5,616,520 A | | 4/1997 | Nishiuma et al. | |
| 5,794,839 A | | 8/1998 | Kimura et al. | |
| 6,040,984 A | * | 3/2000 | Hirakawa | 361/777 |
| 6,358,630 B1 | * | 3/2002 | Tsukada et al. | 428/646 |
| 6,392,898 B1 | * | 5/2002 | Asai et al. | 361/794 |
| 6,485,843 B1 | * | 11/2002 | Eslamy | 428/548 |
| 6,534,723 B1 | * | 3/2003 | Asai et al. | 174/255 |
| 6,835,597 B2 | * | 12/2004 | Murayama | 438/108 |
| 7,007,378 B2 | * | 3/2006 | Gaudiello et al. | 29/842 |
| 7,067,918 B2 | * | 6/2006 | Murata et al. | 257/751 |
| 7,095,682 B2 | | 8/2006 | Shibano et al. | |
| 7,153,758 B2 | | 12/2006 | Hata et al. | |
| 7,226,807 B2 | * | 6/2007 | Okazawa et al. | 438/106 |
| 2001/0029666 A1 | * | 10/2001 | Nakamura et al. | 29/846 |
| 2004/0023487 A1 | | 2/2004 | Shiomi et al. | |
| 2004/0026781 A1 | * | 2/2004 | Nakai | 257/737 |
| 2004/0197949 A1 | | 10/2004 | Hata et al. | |

FOREIGN PATENT DOCUMENTS

| | | |
|---|---|---|
| JP | 06-283844 | 10/1994 |
| JP | 2003-258150 | 9/2003 |

(Continued)

*Primary Examiner* — Chris Chu
(74) *Attorney, Agent, or Firm* — Rabin & Berdo, P.C.

(57) ABSTRACT

A semiconductor device is provided in which a semiconductor chip is bonded to a substrate with a sufficiently increased bonding strength and cracking is assuredly prevented which may otherwise occur due to heat shock, heat cycle and the like. The semiconductor device includes a semiconductor chip and a substrate having a bonding area to which the semiconductor chip is bonded via a metal layer. The metal layer includes an Au—Sn—Ni alloy layer and a solder layer provided on the Au—Sn—Ni alloy layer. Undulations are formed in an interface between the Au—Sn—Ni alloy layer and the solder layer.

6 Claims, 2 Drawing Sheets

FOREIGN PATENT DOCUMENTS

| | | |
|---|---|---|
| JP | 2004-022608 | 1/2004 |
| JP | 2005-093782 A | 4/2005 |
| JP | 2005-217099 A | 8/2005 |

* cited by examiner

SEMICONDUCTOR DEVICE, PRODUCTION METHOD FOR THE SAME, AND SUBSTRATE

This is a Divisional of U.S. application Ser. No. 12/064,434, filed Sep. 4, 2009, the subject matter of which is incorporated herein by reference.

TECHNICAL FIELD

The present invention relates to a semiconductor device, a production method for the semiconductor device, and a substrate to be used for the semiconductor device.

BACKGROUND ART

Conventionally, there exist semiconductor devices which are produced by soldering a semiconductor chip such as an LSI chip on a wiring board having an Au layer formed on a surface thereof and sealing the chip and the board with a resin. The Au layer on the surface of the wiring board is formed by plating or sputtering in order to ensure solder wettability and prevent oxidation of interconnections. When the semiconductor chip is soldered on such a wiring board, however, an Au—Sn alloy layer is formed from Au of the Au layer and Sn of a solder in an interface between the Au layer and the solder, thereby reducing the bonding strength between the semiconductor chip and the wiring board. This causes a problem that cracking occurs from the Au—Sn alloy layer due to heat shock, heat cycle and the like.

To solve this problem, it is proposed to prevent the formation of the Au—Sn alloy layer by significantly reducing the thickness of the Au layer (see, for example, Patent Document 1). However, the formation of the Au—Sn alloy layer is not perfectly prevented by the reduction of the thickness of the Au layer, as long as contacts exist between the Au layer and the solder. Therefore, the Au—Sn alloy layer is locally formed, so that the reduction in the bonding strength between the semiconductor chip and the wiring board is not satisfactorily prevented. Further, the reduction of the thickness of the Au layer reduces the solder wettability. This results in occurrence of voids and improper self-alignment of the semiconductor chip in the soldering of the semiconductor chip.

Therefore, it is proposed to improve the bonding strength between the semiconductor chip and the wiring board by an anchoring effect by forming undulations in an interface between the Au—Sn alloy layer and the solder layer (see, for example, Patent Document 2). With the arrangement according to this proposal, the Au layer has a sufficient thickness, thereby preventing the occurrence of the voids and the improper self-alignment of the semiconductor chip in the soldering of the semiconductor chip.

Patent Document 1: Japanese Unexamined Patent Publication No. 06-283844 (1994)
Patent Document 2: Japanese Unexamined Patent Publication No. 2004-22608

DISCLOSURE OF THE INVENTION

Problems to be Solved by the Invention

The anchoring effect is more advantageously provided, as the level differences of the undulations present in the interface between the Au—Sn alloy layer and the solder layer are increased to cause the Au—Sn alloy layer to more intricately intrude into the solder layer. Where Au and Sn are alloyed, however, it is difficult to cause the Au—Sn alloy layer to have a surface geometry such as to intricately intrude into the solder layer. This makes it difficult to provide a sufficient anchoring effect, thereby making it impossible to increase the bonding strength between the semiconductor chip and the wiring board to a level sufficient to prevent the cracking due to the heat shock, the heat cycle and the like.

It is an object of the present invention to provide a semiconductor device, a production method for the semiconductor device and a substrate to be used for the semiconductor device, which ensure that a semiconductor chip is bonded to a substrate with a higher bonding strength and assuredly prevent the cracking due to the heat shock, the heat cycle and the like.

Means for Solving the Problems

A semiconductor device according to the present invention is a semiconductor device comprising a semiconductor chip and a substrate having a bonding area to which the semiconductor chip is bonded via a metal layer. The metal layer includes an Au—Sn—Ni alloy layer and a solder layer superposed on the Au—Sn—Ni alloy layer. The Au—Sn—Ni alloy layer has undulations in an interface between the Au—Sn—Ni alloy layer and the solder layer.

The undulations in the interface between the Au—Sn—Ni alloy layer and the solder layer are greater in level difference than the undulations in the interface between the Au—Sn alloy layer and the solder layer (see Patent Document 2). The Au—Sn—Ni alloy layer has a surface geometry such as to intricately intrude into the solder layer. Since the Au—Sn—Ni alloy contains Ni and has a higher strength, the Au—Sn—Ni alloy layer more firmly bites the solder layer than the Au—Sn alloy layer. Therefore, the anchoring effect in the interface between the Au—Sn—Ni alloy layer and the solder layer can be enhanced, thereby increasing the bonding strength between the semiconductor chip and the substrate. As a result, the cracking can be assuredly prevented which may otherwise occur due to the heat shock, the heat cycle and the like.

A reason why the undulations in the interface between the Au—Sn—Ni alloy layer and the solder layer are greater in level difference than the undulations in the interface between the Au—Sn alloy layer and the solder layer is supposedly because the presence of Ni promotes the growth of anchor-shape portions of the Au—Sn—Ni alloy layer when the metal layer is formed.

It is preferred that an Au—Sn alloy phase is dispersed in the solder layer. With the Au—Sn alloy phase dispersed in the solder layer, the strength of the solder layer per se is increased, so that the anchoring effect in the interface between the Au—Sn—Ni alloy layer and the solder layer is enhanced. Further, the anchoring effect increases the bonding strength between the semiconductor chip and the substrate.

A reason why the strength of the solder layer per se is increased by dispersing the Au—Sn alloy phase in the solder layer is as follows. If the Au—Sn alloy phase is locally present in the solder layer (e.g., in a surface portion of the solder layer), the cracking may occur from the Au—Sn alloy phase due to the heat shock, the heat cycle and the like. However, if the Au—Sn alloy phase is dispersed in the solder layer, the cracking does not occur from the Au—Sn alloy phase, and the strength of the solder layer is increased by the dispersion strength.

A substrate according to the present invention is a substrate having a bonding area to which a semiconductor chip is to be bonded, wherein an Ni layer is provided in the bonding area, and an Au layer having a thickness of 0.1 to 2.0 μm is provided on a surface of the Ni layer.

With this arrangement, the Au layer, which has a thickness of not less than 0.1 μm, contains Au in an amount required for formation of an Au—Sn—Ni alloy layer having undulations and for dispersion of an Au—Sn alloy phase in a solder layer. Further, the Au layer is not too thick with a thickness of not greater than 2.0 μm. Therefore, Ni can be evenly diffused from the underlying Ni layer into an Au—Sn alloy produced from Au of the Au layer and Sn of a solder at an initial stage of a solder melting step. Therefore, with the use of this substrate, it is possible to form the Au—Sn—Ni alloy layer having the undulations in an interface between the Au—Sn—Ni alloy layer and the solder layer and to disperse the Au—Sn alloy phase in the solder layer. This makes it possible to produce a semiconductor device in which the semiconductor chip is bonded to the substrate with a higher bonding strength and the cracking is assuredly prevented which may otherwise occur due to the heat shock, the heat cycle and the like.

A semiconductor device production method according to the present invention comprises the steps of: providing a substrate having an Ni layer provided in a bonding area thereof to which a semiconductor chip is to be bonded and an Au layer provided on a surface of the Ni layer and having a thickness of 0.1 to 2.0 μm, and forming an Sn-containing solder material layer of an Sn-containing solder material on a surface of the Au layer; mounting the semiconductor chip on a surface of the Sn-containing solder material layer; and heating at a temperature at which the Sn-containing solder material layer is meltable.

According to this production method, an Au—Sn—Ni alloy layer is formed as having undulations in an interface between the Au—Sn—Ni alloy layer and the solder layer, and an Au—Sn alloy phase is dispersed in the solder layer. This makes it possible to produce a semiconductor device in which the semiconductor chip is bonded to the substrate with a higher bonding strength, and the cracking is assuredly prevented which may otherwise occur due to the heat shock, the heat cycle and the like.

The foregoing and other objects, features and effects of the present invention will become more apparent from the following description of the embodiments with reference to the attached drawings.

BEST MODE FOR CARRYING OUT THE INVENTION

Figure 1:
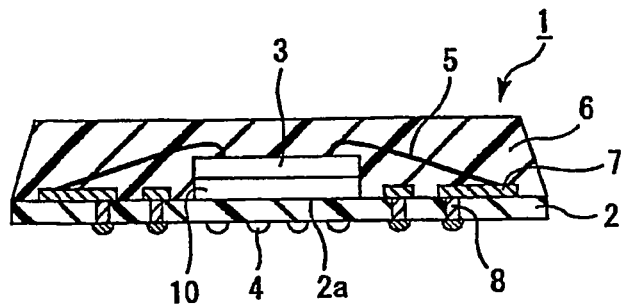
FIG. 1 is a sectional view schematically illustrating a semiconductor device according to one embodiment of the present invention.

FIG. 1 is a sectional view schematically illustrating a semiconductor device according to one embodiment of the present invention. The semiconductor device 1 includes a substrate 2 of a glass fiber reinforced resin. On a front surface of the substrate 2, a conductor circuit 7 having a laminate structure including a Cu layer, an Ni layer and an Au layer stacked in this order is provided in an area other than a bonding area 2a to which a semiconductor chip 3 is bonded.

The glass fiber reinforced resin is not particularly limited, but examples thereof include an epoxy resin, a bismaleimide-triazine resin (BT resin), a polyester resin, a polyimide resin, a phenol resin and materials prepared by impregnating reinforcement materials such as glass fibers with these resins.

Solder bumps 4 are provided on a rear surface of the substrate 2. The solder bumps 4 are electrically connected to the conductor circuit 7 via through-holes 8. This embodiment is directed to a case in which the solder bumps 4 are provided on the rear surface of the substrate 2, but the solder bumps 4 may be omitted. Instead, solder balls or a solder paste may be used for mounting the semiconductor device 1 on a print board.

The semiconductor chip 3 is bonded to the bonding area 2a via a metal layer 10. The metal layer 10 will be described in detail later. Any of various types of semiconductor chips may be used as the semiconductor chip 3, and the specific function and internal circuit configuration of the semiconductor chip is not particularly limited. The semiconductor chip 3 has electrodes (not shown) on its upper surface. The electrodes are electrically connected to the conductor circuit 7 via wires 5.

The semiconductor device 1 includes a resin package 6 which seals the semiconductor chip 3. The rear surface of the substrate 2 including the solder bumps 4 is exposed from the resin package 6. The resin package 6 is composed of, for example, a resin composition containing an epoxy resin and the like.

Figure 2:
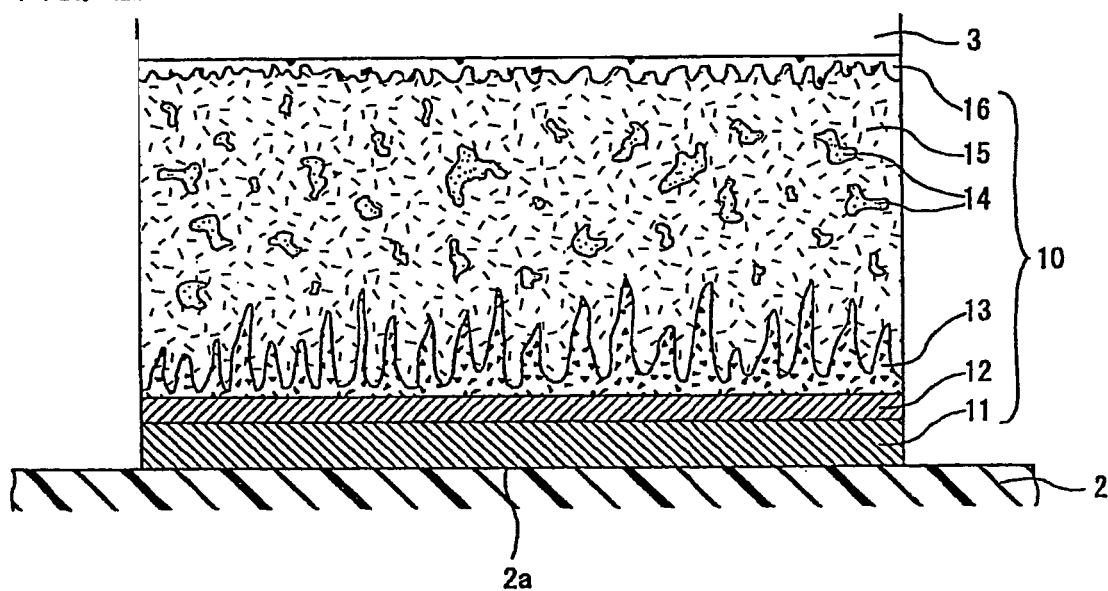
FIG. 2 is an enlarged partial sectional view schematically illustrating a portion of the semiconductor device of FIG. 1 around a bonding area.

FIG. 2 is an enlarged partial sectional view schematically illustrating a portion of the semiconductor device of FIG. 1 around the bonding area. The metal layer 10 includes a Cu layer 11, an Ni layer 12, an Au—Sn—Ni alloy layer 13, a solder layer 15 and an Au—Sn alloy layer 16.

Undulations are formed in an interface between the Au—Sn—Ni alloy layer 13 and the solder layer 15. The surface of the Au—Sn—Ni alloy layer 13 intricately intrudes into the solder layer 15.

The shape of the undulations present in the interface between the Au—Sn—Ni alloy layer 13 and the solder layer 15 is not particularly limited, but is desirably an irregular nonlinear pattern having peaks and troughs which are different in height and depth. More desirably, the Au—Sn—Ni alloy layer intrudes into the solder layer in a wedge form or a villous form. As the intricacy of the undulations increases, the anchoring effect is enhanced. The anchoring effect increases the bonding strength between the semiconductor chip 3 and the substrate 2.

Further, undulations are formed in an interface between the Au—Sn alloy layer 16 and the solder layer 15. The surface of the Au—Sn alloy layer 16 intricately intrudes into the solder layer 15. To enhance the anchoring effect, the shape of the undulations present in the interface between the Au—Sn alloy layer 16 and the solder layer 15 is desirably an irregular nonlinear pattern having peaks and troughs which are different in height and depth. More desirably, the Au—Sn alloy layer intrudes into the solder layer in a wedge form or a villous form.

An Au—Sn alloy phase 14 is dispersed in the solder layer 15. The constituents of the solder layer 15 are not particularly limited, but defined by the composition of an Sn-containing solder material to be used for production of the semiconductor device 1. The Sn-containing solder material will be described in detail later. It is desirable that the Au—Sn alloy phase 14 is vertically evenly dispersed in the solder layer 15 (in a direction extending from the substrate 2 toward the semiconductor chip 3). The dispersion of the Au—Sn alloy phase 14 effectively prevents the cracking, and increases the strength of the solder layer 15 per se.

In the semiconductor device 1 according to this embodiment, the metal layer 10 which bonds the semiconductor chip 3 to the substrate 2 includes the Au—Sn—Ni alloy layer 13 and the solder layer 15, and the undulations are present in the interface between the Au—Sn—Ni alloy layer 13 and the solder layer 15. Therefore, the anchoring effect is enhanced in the interface between the Au—Sn—Ni alloy layer 13 and the solder layer 15, and the bonding strength of the semiconductor chip 3 and the substrate 2 is, increased by the anchoring effect. Further, the Au—Sn alloy phase 14 is dispersed in the solder layer 15, and the strength of the solder layer 15 per se is increased by the dispersion, whereby the anchoring effect is further enhanced in the interface between the Au—Sn—Ni alloy layer 13 and the solder layer 15. Therefore, the bonding strength between the semiconductor chip 3 and the substrate 2 is further increased by the anchoring effect. As a result, the cracking is assuredly prevented which may otherwise occur due to the heat shock, the heat cycle and the like.

Next, a substrate 2 according to the present invention will be described with reference to FIGS. 1 and 3.

Figure 3:
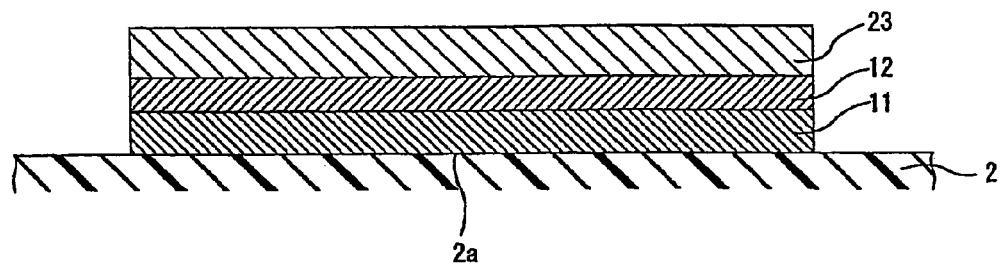
FIG. 3 is an enlarged partial sectional view schematically illustrating a portion of a substrate around a bonding area according to one embodiment of the present invention.

FIG. 3 is an enlarged partial sectional view schematically illustrating a portion of a substrate around a bonding area according to one embodiment of the present invention.

First, the substrate 2 will be generally explained. As described with reference to FIG. 1, a conductive circuit 7 is provided on a front surface of the substrate 2 in an area other than the bonding area 2a. Solder bumps 4 are provided on a rear surface of the substrate 2. The solder bumps 4 are electrically connected to the conductor circuit 7 via through-holes 8.

As shown in FIG. 3, a Cu layer 11, an Ni layer 12 and an Au layer 23 are provided in the bonding area 2a of the substrate 2 in this order from the side of the substrate 2.

The thickness of the Cu layer 11 is not particularly limited, but may be properly determined. The Cu layer 11 may be formed as having the same thickness as the Cu layer of the conductor circuit 7 when the Cu layer of the conductor circuit 7 is formed. A method for the formation of the Cu layer 11 is not particularly limited, but a vacuum evaporation method, a sputtering method, a plating method, a printing method or the like may be used for the formation of the Cu layer 11. Further, the formation of the Cu layer 11 may be achieved by forming a thin Cu film on the front surface of the substrate and selectively etching the thin Cu film.

The thickness of the Ni layer 12 is not particularly limited, but may be properly determined. A method for formation of the Ni layer 12 is not particularly limited, but a vacuum evaporation method, a sputtering method, a plating method, a printing method or the like may be used for the formation of the Ni layer 12.

The Au layer 23 has a thickness of 0.1 to 2.0 µm. Thus, an Au—Sn—Ni alloy layer 13 can be formed as having the undulations in the interface between the Au—Sn—Ni alloy layer 13 and a solder layer 15, and an Au—Sn alloy phase 14 can be dispersed in the solder layer 15. If the thickness of the Au layer 23 is less than 0.1 µm, the Au layer 23 is too thin, thereby making it difficult to supply Au from the Au layer 13 in an amount required for the formation of the Au—Sn—Ni alloy layer 13 having the undulations and for the dispersion of the Au—Sn alloy phase 14 in the solder layer 15. On the other hand, if the thickness of the Au layer 23 is greater than 2.0 µm, the Au layer 23 is too thick, thereby making it difficult to evenly diffuse Ni from the underlying Ni layer 12 into an Au—Sn alloy layer which is formed of Au from the Au layer 23 and Sn from the solder at an initial stage of a solder melting step. Further, an excessively great thickness of the Au layer 23 disadvantageously increases the costs.

A preferred lower limit and a preferred upper limit of the thickness of the Au layer 23 are 0.5 µm and 1.0 µm, respectively, for promoting the formation of the Au—Sn—Ni alloy layer 13 having the undulations and the dispersion of the Au—Sn alloy phase 14 in the solder layer 15. A method for the formation of the Au layer 23 is not particularly limited, but a vacuum evaporation method, a sputtering method, a plating method, a printing method or the like may be used for the formation of the Au layer 23.

In the substrate 2 according to this embodiment, the thickness of the Au layer 23 is 0.1 to 2.0 µm. Further, the Au layer 23 contains Au in an amount required for the formation of the Au—Sn—Ni alloy layer 13 having the undulations and for the dispersion of the Au—Sn alloy phase 14 in the solder layer 15, and has a thickness sufficient to permit Ni to evenly diffuse from the Ni layer 12 into the Au—Sn alloy. With the use of this substrate 2, therefore, the Au—Sn—Ni alloy layer 13 can be formed as having the undulations in the interface between the Au—Sn—Ni alloy layer 13 and the solder layer 15, and the Au—Sn alloy phase 14 can be dispersed in the solder layer 15. This makes it possible to produce a semiconductor device in which a semiconductor chip 3 is bonded to the substrate 2 with a higher bonding strength and the cracking is assuredly prevented which may otherwise occur due to the heat shock, the heat cycle and the like.

Next, a semiconductor device production method according to the present invention will be described with reference to FIGS. 1 to 4.

Figure 4:
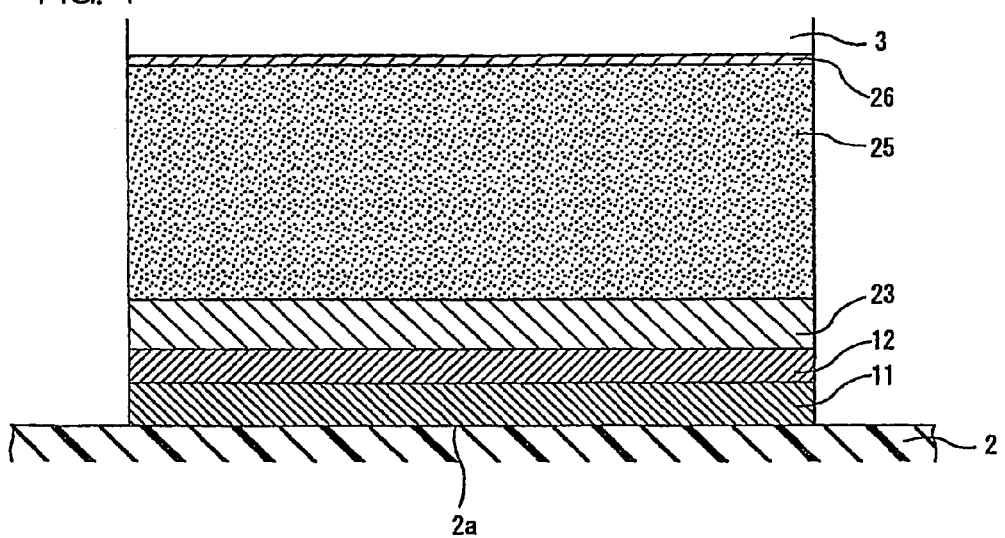
FIG. 4 is an enlarged partial sectional view schematically illustrating the portion around the bonding area at the completion of a mounting step.

(A) First, an Au layer 26 is formed on a rear surface of a semiconductor chip 3 by a plating method or the like (see FIG. 4). The thickness of the Au layer 26 is not particularly limited.

(B) Then, an Sn-containing solder material layer 25 is formed from an Sn-containing solder material on a surface of the Au layer 23 on the substrate 2 in a forming step. The Sn-containing solder material is not particularly limited, as long as it contains Sn. Examples of the Sn-containing solder material include solder materials, such as solder pastes and solder creams, containing an Sn—Pb alloy, an Sn—Pb—Ag alloy, an Sn—Pb—Bi alloy, an Sn—Pb—In alloy, an Sn—Pb—In—Sb alloy, an Sn—Ag alloy, an Sn—Cu alloy and other alloys of elemental Sn. Further, a higher melting point Pb solder material (a Pb—Sn alloy solder material containing not lower than 85 mass % of Pb) may be used as the Sn-containing solder material. An example of the higher melting point Pb solder material is a Pb-8Sn-2Ag alloy (a solder material of an alloy containing 8 wt % of Sn, 2 wt % of Ag and the balance of Pb and inevitable impurities).

(C) The semiconductor chip 3 having the Au layer 26 formed on the rear surface thereof in the step (A) is mounted on an upper surface of the Sn-containing solder material layer 25 in a mounting step. FIG. 4 is an enlarged partial sectional view schematically illustrating the portion around the bonding area at the completion of the mounting step. A Cu layer 11, an Ni layer 12, an Au layer 23 and the Sn-containing solder material layer 25 are provided in the bonding area 2a of the substrate 2 in this order from the side of the substrate 2. The semiconductor chip 3 having the Au layer 26 formed on the rear surface thereof is disposed on the Sn-containing solder material layer 25.

(D) Next, the substrate 2 mounted with the semiconductor chip 3 is heated at a temperature at which the Sn-containing solder material layer 25 is meltable in a heating step. The temperature at which the Sn-containing solder material layer 25 is meltable (melting temperature) is not lower than 260° C., preferably not lower than about 295° C. In the heating step, a reflow period is 10 to 60 seconds. As shown in FIGS. 2 and 4, an Au—Sn alloy is produced from Sn contained in the Sn-containing solder material layer 25 and Au of the Au layer 23 and Ni is diffused from the Ni layer 11 into the Au—Sn alloy by the heating, whereby an Au—Sn—Ni alloy layer 13 is formed as having undulations in an interface between the Au—Sn—Ni alloy layer 13 and the solder layer 15. At this time, the presence of Ni promotes the growth of anchor-shape portions of the Au—Sn—Ni alloy layer 13, so that the undulations present in the interface have greater level differences. Thus, the Au—Sn—Ni alloy layer 13 has a surface geometry such as to intricately intrude into the solder layer 15. Further, an Au—Sn alloy layer 16 is formed from Sn contained in the Sn-containing solder material layer 25 and Au of the Au layer 26 as having undulations in an interface between the Au—Sn alloy layer 16 and the solder layer 15. Furthermore, the Au—Sn alloy produced from Sn contained in the Sn-containing solder material layer 25 and Au of the Au layer 22 or the Au layer 26 is partly dispersed as an Au—Sn alloy phase 14 in the solder layer 15. As a result, a metal layer 10 is formed as shown in FIG. 2, and the semiconductor chip 3 is bonded to the substrate 2 via the metal layer 10.

Subsequently, electrodes provided on an upper surface of the semiconductor chip 3 are connected to a conductor circuit 7 by wire-bonding with the use of wires 6 as shown in FIG. 1. Thereafter, a resin package 6 is formed from a resin composition containing an epoxy resin or the like to provide the semiconductor device 1.

According to the inventive semiconductor device production method, the Au—Sn—Ni alloy layer 13 is formed as having the undulations in the interface between the Au—Sn—Ni alloy layer 13 and the solder layer 15, and the Au—Sn alloy phase 14 is dispersed in the solder layer 15. This makes it possible to produce the semiconductor device in which the semiconductor chip 3 is bonded to the substrate 2 with a higher bonding strength and the cracking is assuredly prevented which may otherwise occur due to the heat shock, the heat cycle and the like.

While the embodiments of the present invention have thus been described, it should be understood that the invention be not limited to these embodiments. Although the embodiments are directed to a case in which the Au—Sn—Ni alloy layer is formed on a lower side (substrate side) of the solder layer, the Au—Sn—Ni alloy layer may be formed, for example, on an upper side (semiconductor chip side) of the solder layer. Further, Au—Sn—Ni alloy layers may be formed on upper and lower sides of the solder layer.

Although the embodiments are directed to a case in which the Au—Sn alloy phase is dispersed in the solder layer, the Au—Sn alloy phase is not necessarily required to be dispersed in the solder layer.

Further, the embodiments are directed to a case in which the substrate has a single layer structure, but the substrate may have a laminate structure including a plurality of plates. Further, a lead frame may be employed as the substrate.

The resin to be used for the formation of the resin package is not particularly limited, but an example thereof is a resin composition containing a thermosetting epoxy resin as a major resin component, a phenol resin as a curing agent component and an inorganic filler. A heat-resistant thermoplastic resin such as a PPS (polyphenylene sulfide) resin or a PPE (polyphenylene ether) resin may be used instead of the epoxy resin as the major resin component. The inorganic filler is not particularly limited, but examples thereof include quartz glass, crystalline silica and molten silica.

The embodiments are directed to a case in which the semiconductor device is of a BGA (Ball Grid Array) package type. However, the package type is not particularly limited. Examples of the package type include LGA (Land Grid Array), QFP (Quad Flat Package), QFN (Quad Flat Non-leaded package), QFJ (Quad Flat J leaded package), SOP (Small Out-line Package), SOJ (Small Out-line J leaded package), DIP (Dual In-line Package) and SIP (Single In-line Package).

Various modifications may be made within the scope of the present invention defined by the claims. That is, it should be understood that the embodiments described above are merely illustrative of the technical principles of the present invention but not limitative of the invention. The spirit and scope of the present invention are to be limited only by the appended claims.

This application corresponds to Japanese Patent Application No. 2005-240285 filed in the Japanese Patent Office on Aug. 22, 2005, the disclosure of which is incorporated herein by reference.

The invention claimed is:

1. A substrate having a bonding area to which a semiconductor chip is to be bonded, wherein:
    an Ni layer is provided in the bonding area, and an Au layer having a thickness of 0.1 to 2.0 μm is provided on a surface of the Ni layer;
    the bonding area has a dimension such that an entire back surface of the semiconductor chip is to be bonded; and
    the Ni layer and the Au layer are each continuous layers extending over an entirety of the bonding area.

2. A substrate as set forth in claim 1, wherein a Cu layer is provided in the bonding area, and the Ni layer is provided on a surface of the Cu layer.

3. A substrate as set forth in claim 1, further having a conductor circuit provided in an area other than the bonding area, wherein the conductor circuit has a laminate structure including a Cu layer, an Ni layer and an Au layer stacked in an order prescribed herein.

4. A substrate as set forth in claim 3, further having a solder bump provided on a rear surface of the substrate, and the solder bump is electrically connected to the conductor circuit through a through hole.

5. A substrate as set forth in claim 1, wherein the substrate is made of a glass fiber reinforced resin.

6. A substrate as set forth in claim 5, wherein the glass fiber reinforced resin includes glass fibers and a resin selected from a group consisted of an epoxy resin, a bismaleimide-triazine resin, a polyester resin, a polyimide resin, and a phenel resin.

* * * * *